(12) United States Patent
Yoshimori et al.

(10) Patent No.: US 10,578,652 B2
(45) Date of Patent: Mar. 3, 2020

(54) ELECTRIC CURRENT DETECTOR AND CORE COMPONENT USED THEREFOR

(71) Applicant: SHT CORPORATION LIMITED, Izumisano-shi, Osaka (JP)

(72) Inventors: Hitoshi Yoshimori, Izumisano (JP); Takashi Yoshimori, Izumisano (JP)

(73) Assignee: SHT CORPORATION LIMITED, Izumisano-shi (JP)

( * ) Notice: Subject to any disclaimer, the term of this patent is extended or adjusted under 35 U.S.C. 154(b) by 0 days.

(21) Appl. No.: 16/108,457

(22) Filed: Aug. 22, 2018

(65) Prior Publication Data

US 2018/0356447 A1 Dec. 13, 2018

Related U.S. Application Data

(62) Division of application No. 14/674,716, filed on Mar. 31, 2015, now Pat. No. 1,088,504, which is a division (Continued)

(30) Foreign Application Priority Data

Jan. 28, 2010 (JP) ................................. 2010-016117

(51) Int. Cl.
*G01R 15/20* (2006.01)
(52) U.S. Cl.
CPC .......... *G01R 15/202* (2013.01); *G01R 15/207* (2013.01); *Y10T 29/4998* (2015.01)
(58) Field of Classification Search
CPC . G01R 1/20; G01R 1/22; G01R 11/06; G01R 19/20; G01R 33/0283; G01R 15/20;

(Continued)

(56) References Cited

U.S. PATENT DOCUMENTS 4,153,910 A     5/1979   Itoh et al.
4,972,140 A * 11/1990   Okazaki ............... G01R 15/202
                                                                       324/117 H (Continued)

FOREIGN PATENT DOCUMENTS

EP       1847836 A2   10/2007
JP      06-025763 U    4/1994

(Continued)

OTHER PUBLICATIONS

International Search Report of PCT/JP2010/068553, dated Jan. 25, 2011.

(Continued)

*Primary Examiner* — Son T Le
*Assistant Examiner* — Robert P Alejnikov, Jr.
(74) *Attorney, Agent, or Firm* — Westerman, Hattori, Daniels & Adrian, LLP

(57) ABSTRACT

In an electric current detector according to the present invention, an annular core 2 having a magnetic gap G and a Hall element 41 which is located in the magnetic gap of the core 2 and detects a magnitude of an electric current passing through the core 2 are arranged in an outer case 1. Here, in the core 2, a mold resin portion 3 which covers a surface of the core 2 over part of an overall length along a magnetic path thereof is molded at one or a plurality of portions along the magnetic path to configure an integral core component, the core component being fixed into the outer case 1 in a state where a surface of the mold resin portion 3 makes contact with an inner surface of the outer case 1.

2 Claims, 6 Drawing Sheets

Related U.S. Application Data of application No. 13/575,805, filed as application No. PCT/JP2010/068553 on Oct. 21, 2010, now Pat. No. 9,035,643.

(58) Field of Classification Search
CPC ...... G01R 21/08; G01R 33/075; G01R 1/203; G01R 15/146; G01R 19/0007; G01R 33/0206; G01R 33/028; G01R 33/038; G01R 33/1215; G01R 15/202; G01R 15/207; G05G 2009/04755; G06G 7/162; B64G 1/366; Y10T 29/4998
USPC ................. 324/117 H, 117 R, 126, 127, 251
See application file for complete search history.

(56) References Cited

U.S. PATENT DOCUMENTS

| | | |
|---|---|---|
| 5,541,447 A | 7/1996 | Maejima et al. |
| 6,246,172 B1 * | 6/2001 | Bizen ................. H01F 41/0226 315/5.41 |
| 6,417,661 B1 | 7/2002 | Berkcan et al. |
| 6,545,456 B1 * | 4/2003 | Radosevich ......... G01R 15/202 324/117 H |
| 7,600,432 B2 | 10/2009 | Nomura et al. |
| 2009/0128129 A1 | 5/2009 | Aratani |

FOREIGN PATENT DOCUMENTS

| | | |
|---|---|---|
| JP | 06-086080 U | 12/1994 |
| JP | 3037663 U | 3/1997 |
| JP | 2006-32786 A | 2/2006 |
| JP | 2006-078255 A | 3/2006 |
| JP | 2007-088019 A | 4/2007 |
| JP | 2008-145352 A | 6/2008 |

OTHER PUBLICATIONS

Japanese Office Action dated Jan. 21, 2014, issued in corresponding Japanese Patent Application No. 2012-219043, w/English translation, (9 pages).
Extended European Search Report dated Jan. 20, 2015, issued in European Application No. 10844661.8. (7 pages).

* cited by examiner

ELECTRIC CURRENT DETECTOR AND CORE COMPONENT USED THEREFOR

CROSS-REFERENCE TO RELATED APPLICATIONS

This application is a divisional of U.S. application Ser. No. 14/674,716, filed on Mar. 31, 2015, and wherein U.S. application Ser. No. 14/674,716 is a divisional of U.S. application Ser. No. 13/575,805, filed on Jul. 27, 2012, and wherein U.S. application Ser. No. 13/575,805 is a national stage application filed under 35 U.S.C. § 371 of International Application No. PCT/JP2010/068553, filed Oct. 21, 2010, which is based upon and claims the benefit of priority of the prior Japanese Patent Application No. 2010-016117, filed on Jan. 28, 2010, the entire contents of which are incorporated herein by reference.

TECHNICAL FIELD

The present invention relates to an electric current detector which detects a magnitude of an electric current by using an electromagnetic conversion element such as a Hall element, and a core component used for the electric current detector.

BACKGROUND ART

As shown in FIG. 9, there has been known such an electric current detector in which a core (7) having a magnetic gap G and a printed circuit board (4) to which a Hall element (41) is attached are accommodated in an outer case (6), the Hall element (41) being interposed in the magnetic gap G of the core (7).

When an electric current passes through the hollow portion of the core (7), the magnitude of the electric current is detected by the Hall element (41).

Typically, the electric current detector in which the outer case is previously resin molded is adopted. After the core is accommodated in a core accommodating chamber formed in the outer case, a synthetic resin (e.g., an epoxy resin) is filled into the core accommodating chamber to fix the core into the outer case (see Patent Document 1).

In the assembling process of the electric current detector in which the synthetic resin is filled into the outer case, first, the core is accommodated in the core accommodating chamber in the outer case to temporarily fix the core into the outer case, and the synthetic resin is filled into the outer case to fix the core into the outer case, thereby performing electric insulation with respect to the core.

In this connection, in the electric current detector, the Hall element is required to be precisely positioned in the magnetic gap of the core.

However, in the electric current detector in which the synthetic resin is filled into the outer case, a large space (clearance) is necessary for filling the synthetic resin into the outer case, resulting in increase in size of the outer case. In addition, to ensure positioning accuracy for temporarily fixing the core into the outer case, a complicate configuration for forming a positioning projection on the inner surface of the case, or the like is necessary. The positioning operation of the core is troublesome.

PRIOR ART DOCUMENT

Patent Document

Patent Document 1: Japanese Patent Laid-open Publication No. 2006-78255

SUMMARY OF THE INVENTION

Problems to be Solved by the Invention

Accordingly, the applicant has developed the electric current detector in which, as shown in FIG. 9, the core (7) is covered with mold resins (61), (62) to form the outer case (6) with the mold resins (61),(62).

In such an electric current detector, the complicate configuration and the troublesome operation for temporarily fixing the core into the outer case are not necessary, thereby improving assembling accuracy.

However, in the electric current detector in which, as shown in FIG. 9, the core (7) is covered with the mold resins (61), (62), and the core (7) receives an external force from the surrounding resins at the time of resin molding, thereby causing large hysteresis in a relation (BH curve) between a coercive force (Hc) and a residual magnetic flux density (Br).

In addition, fine dust can enter into the resins at the time of resin molding, with the result that the dust is exposed on the surface of the outer case (6) to lower the yield due to poor appearance.

Accordingly, an object of the present invention intend to provide an electric current detector which can reduce hysteresis without being increased in size, can precisely and easily position a core into an outer case, and can prevent the yield from being lowered, and a core component used therefor.

Means for Solving the Problems

In an electric current detector according to the present invention, an annular core (2) having a magnetic gap G and an electromagnetic conversion element which is located in the magnetic gap of the core (2) and detects a magnitude of an electric current passing through the core (2) are arranged in an outer case (1).

Here, in the core (2), a mold resin portion (3) which covers a surface of the core (2) over part of an overall length along a magnetic path thereof is molded at one or a plurality of portions along the magnetic path to configure an integral core component (20), the core component (20) being fixed into the outer case (1) in a state where a surface of the mold resin portion (3) makes contact with an inner surface of the outer case (1).

In the electric current detector of the present invention, after the outer case (1) and the core component (20) are previously manufactured in individual processes, the core component (20) is fixed into the outer case (1).

In the core component (20), part of the overall length along the magnetic path of the core (2) is only covered with the mold resin portion (3). Therefore, a force that the core (2) receives from the surroundings thereof at the time of molding the mold resin portion (3) is relatively small, thereby preventing hysteresis in the core (2) from being increased.

The outer case (1) and the core component (20) can obtain high accuracy in outer shape dimensions thereof by quality control in individual resin molding processes. Therefore, in the process for fixing the core component (20) into the outer case (1), the surface of the mold resin portion (3) is made in contact with the inner surface of the outer case (1), so that the core (2) can be precisely positioned into the outer case (1). In this state, the mold resin portion (3) is engaged into the outer case (1), so that the core component (20) is fixed into the outer case (1).

In addition, the outer case (1) is manufactured in the resin molding process different from that of the core component (20), so that any foreign particles such as dust can be prevented from entering into the resin which is the material of the outer case (1), thereby improving the manufacturing yield.

In a specific form, the core (2) has a polygonal shape having a plurality of corners, and the mold resin portion (3) is formed to cover at least one of the corners.

According to the specific form, the mold resin portion (3) is formed at a corner of the core (2), and the mold resin portion (3) makes contact with the inner surface of the outer case (1) to position the core component (20). Two surfaces of the mold resin portion (3) make close contact with the inner surface of the outer case (1), thereby improving positioning accuracy.

A core component for an electric current detector according to the present invention includes an annular core (2) having a magnetic gap G and a mold resin portion (3) which covers a surface of the core (2) over part of an overall length along a magnetic path of the core (2), and a manufacturing method of the core component includes:

manufacturing an annular core member (21);

molding a mold resin portion (32) which covers a surface of the core member (21) over part of an overall length along a magnetic path of the manufactured annular core member (21); and cutting the core member (21) and the mold resin portion (32) in a region in which the mold resin portion (32) is formed and forming the magnetic gap G and two mold resin portions (3a), (3b).

In the manufacturing method of the core component according to the present invention, after the mold resin portion (32) is molded on the core member (21), the core member (21) and the mold resin portion (32) are cut to form the magnetic gap G. Therefore, when the core member (21) is a stacked type core member in which a plurality of electromagnetic steel plates are stacked, in the cutting process, the plurality of electromagnetic steel plates are constrained by the surroundings thereof by the mold resin portion (32), and are cut. This can avoid the separation of some electromagnetic steel plates and the entering of any cutting pieces and metal burrs, which are caused by the cutting, into the mold resin portion (32).

Effects of the Invention

The electric current detector according to the present invention and the core component used therefor can reduce hysteresis without being increased in size, can precisely and easily position the core into the outer case, and can prevent the yield from being lowered.

DETAILED DESCRIPTION OF EMBODIMENTS

Hereinafter, an embodiment of the present invention will be specifically described with reference to the drawings.

Figure 1:
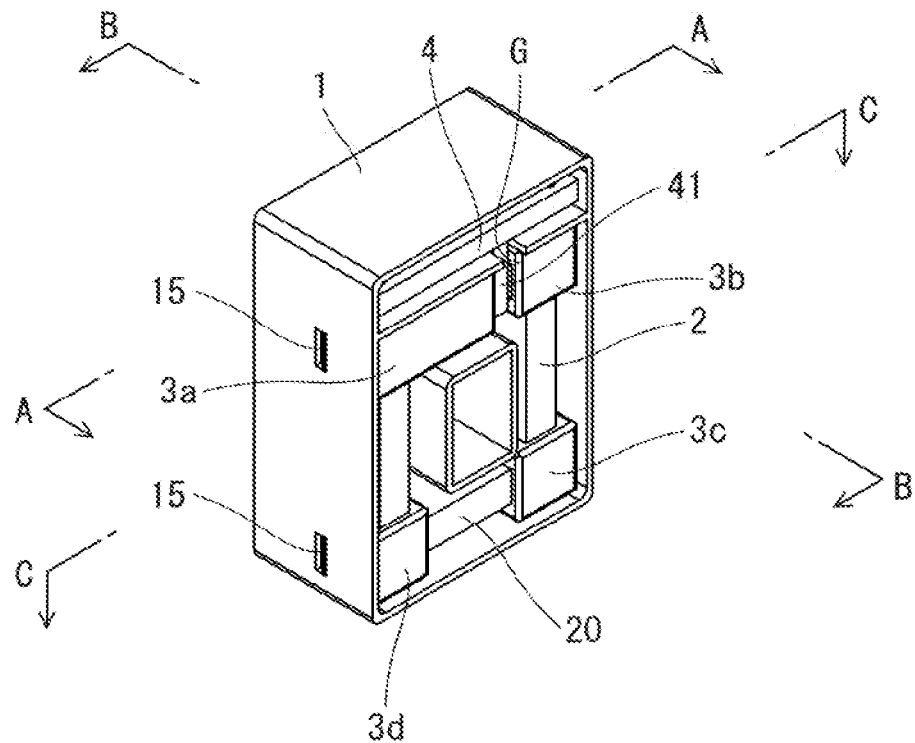
FIG. 1 is a perspective view of an electric current detector according to the present invention.
Figure 2:
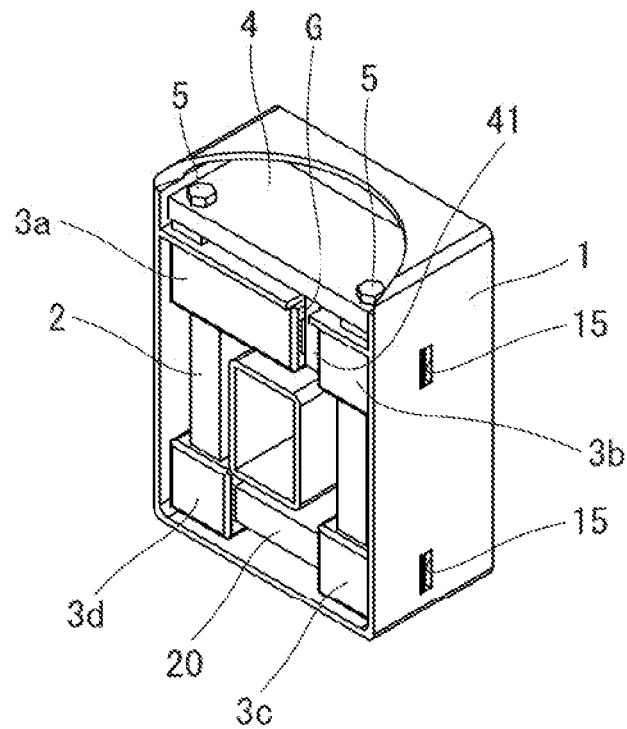
FIG. 2 is a perspective view, partially broken away, of the electric current detector.

As shown in FIGS. 1 and 2, in an electric current detector according to the present invention, the electric current detector accommodate a core component (20) having a magnetic gap G, and a printed circuit board (4) having a Hall element (41) in an outer case (1) made of a synthetic resin.

Figure 6:
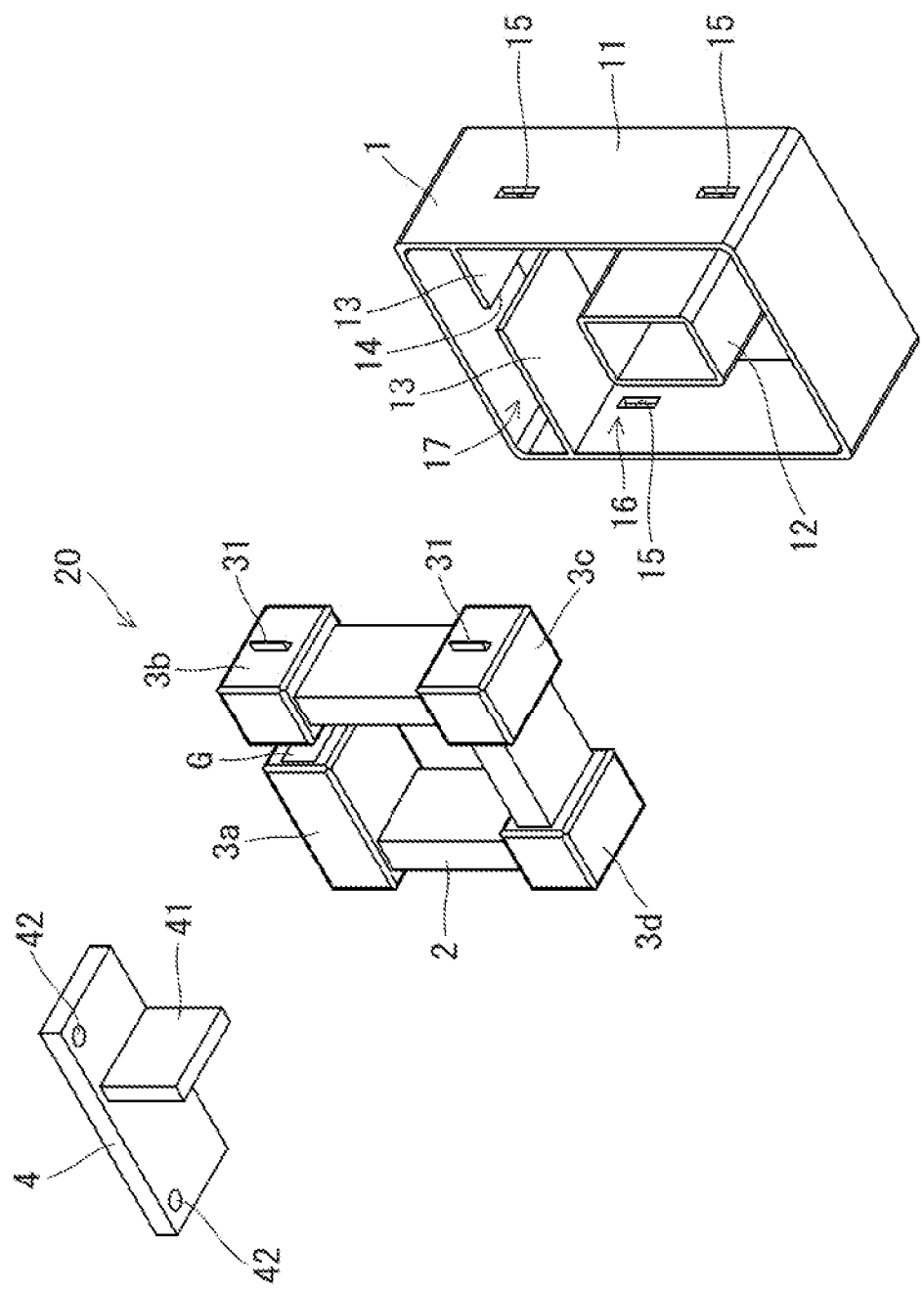
FIG. 6 is an exploded perspective view of the electric current detector according to the present invention.

As shown in FIG. 6, in the outer case (1), an inner peripheral wall (12) in a square tubular shape and a planar partitioning wall (13) are integrally molded in an inner space surrounded by an outer peripheral wall 11 in a square tubular shape, the inner space being partitioned into a core accommodating chamber (16) and a board accommodating chamber (17) by the partitioning wall (13). The partitioning wall (13) can be omitted.

A cutaway (14) is formed in the partitioning wall (13). In addition, one or more slits (15), (15) (two slits in the embodiment) are formed in each of the right and left wall surfaces of the outer peripheral wall (11).

The core component (20) has a core (2) having a substantially square annular shape and the magnetic gap G, and four mold resin portions (3a), (3b), (3c), (3d), which cover four corners of the core (2). A projection (31) is integrally formed on the side surface of a mold resin portion (3) so as to be engageable into the corresponding slit (15) in the outer case (1).

The Hall element (41) is formed to be planar, and is erected vertically on the surface of the printed circuit board (4). In addition, two screw holes (42), (42) are formed in both ends of the printed circuit board (4). The Hall element (41) can also be surface mounted on the printed circuit board (4).

The core component (20) is accommodated in the core accommodating chamber (16) in the outer case (1), and the printed circuit board (4) is accommodated in the board accommodating chamber (17) in the outer case (1). In this state, the Hall element (41) passes through the cutaway (14) in the outer case (1), and is interposed in the magnetic gap G of the core component (20) (see FIGS. 3 to 5).

Figure 3:
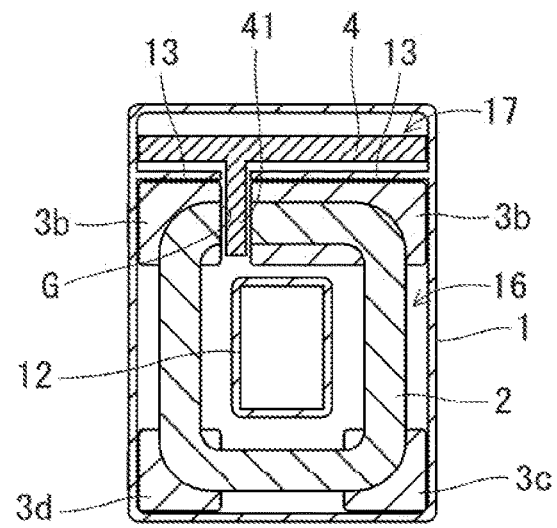
FIG. 3 is a cross-sectional view taken along line A-A of FIG. 1.
Figure 4:
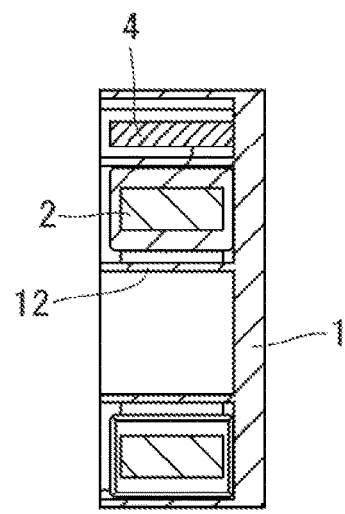
FIG. 4 is a cross-sectional view taken along line B-B of FIG. 1.

In the state where the core component (20) is accommodated in the core accommodating chamber (16) in the outer case (1), as shown in FIG. 3, four mold resin portions (3a), (3b), (3c), (3d) of the core component (20) are provided at four corners of the core accommodating chamber (16) in the outer case (1), respectively, and two surfaces of the mold resin portion (3) orthogonal to each other make contact with the inner surface of the outer case (1). Thereby, the core component (20) is precisely positioned into the outer case (1).

Figure 5:
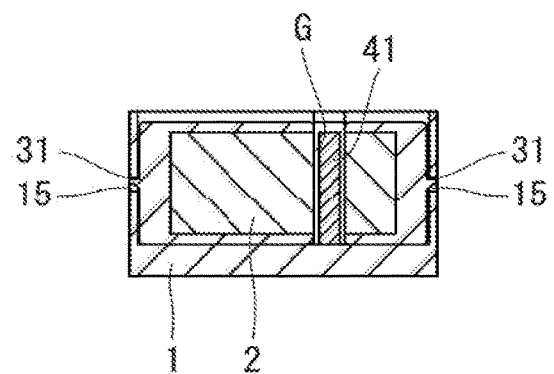
FIG. 5 is a cross-sectional view taken along line C-C of FIG. 1.

As shown in FIG. 5, the projection (31) of the mold resin portion (3) is engaged into the slit (15) in the outer case (1), thereby fixing the core component (20) into the outer case (1).

As shown in FIG. 2, the printed circuit board (4) is fixed into the outer case (1) by screwing two screws (5), (5) from the screw holes (42), (42) shown in FIG. 6 into the partitioning wall (13) in the outer case (1). Other fixing methods different from the fastening method using the screw (5) can also be adopted.

Thereby, the Hall element (41) is held in the precise position in the magnetic gap G of the core component (20).

Figure 7:
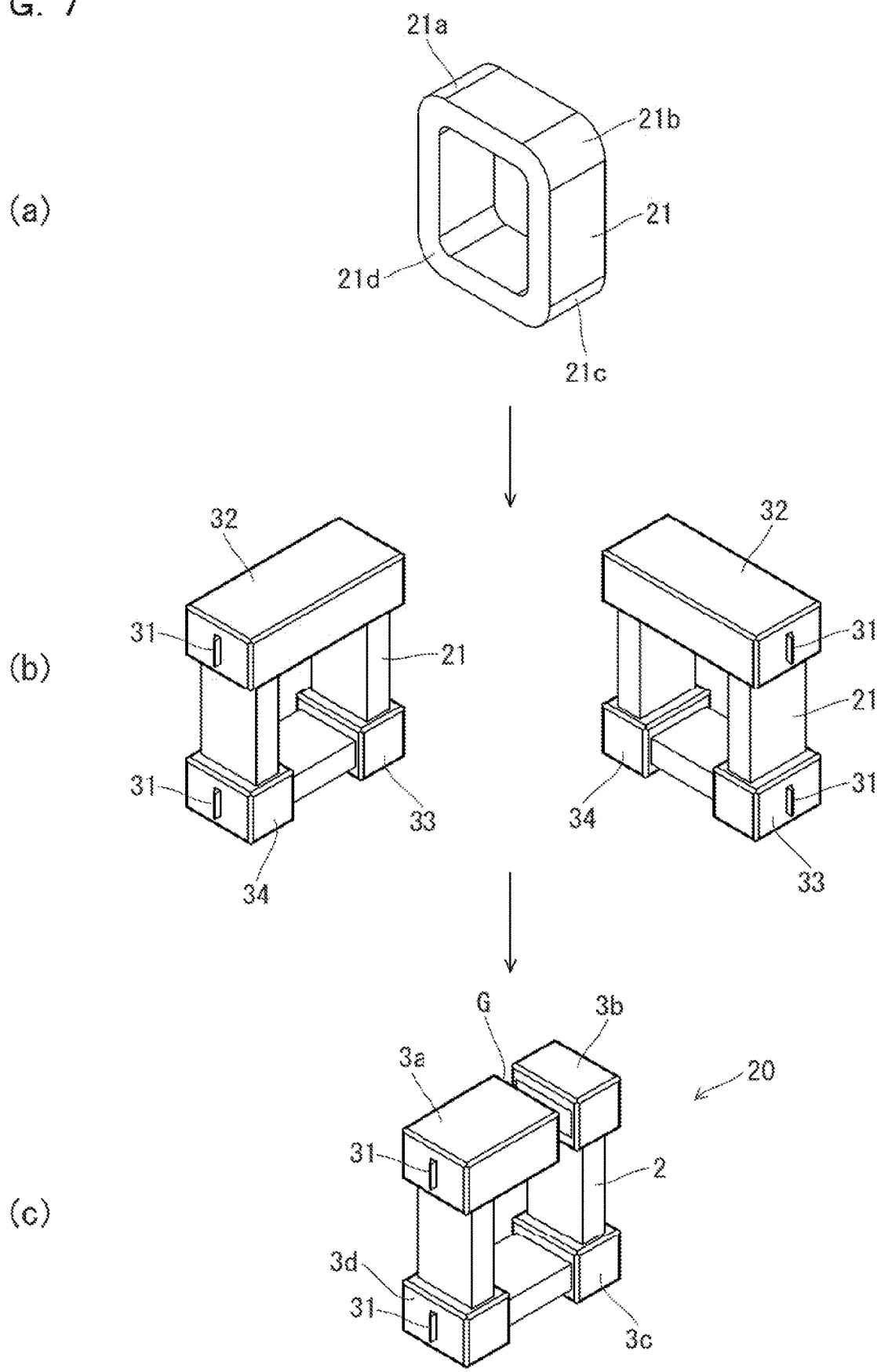
FIG. 7 is a process diagram showing a manufacturing method of a core component according to the present invention.

FIG. 7 shows the manufacturing process of the core component (20) according to the present invention.

First, as shown in FIG. 7 (a), a core member (21) which has a substantially square annular shape and four corners (21a), (21b), (21c), (21d) is manufactured. The core member (21) is manufactured, for example, by helically winding a belt-shaped electromagnetic plate.

Next, as shown in FIG. 7(b), a first mold resin portion (32) which has a long rectangular parallelepiped shape and covers two corners (21a), (21b) on the upper side of the core member (21), a second mold resin portion (33) which has a short rectangular parallelepiped shape and covers one corner (21c) on the lower side thereof, and a third mold resin portion (34) which has a short rectangular parallelepiped shape and covers the other corner (21d) on the lower side thereof are molded. Here, the projection (31) is integrally molded on the side surface of each of the mold resin portions.

Finally, the core member (21) and the first mold resin portion (32) are cut by a cutter (not shown) in the range of the first mold resin portion (32). Therefore, as shown in FIG. 7(c), the core component (20) which has the magnetic gap G and four mold resin portions (3a), (3b), (3c), (3d) is obtained.

The core component (20) and the printed circuit board (4), which have been obtained in such a manner are fixed into the separately manufactured outer case (1). Therefore, the electric current detector of the present invention shown in FIGS. 1 to 5 is completed.

Here, the resin for fixing the core component (20) is not filled into the outer case (1).

Figure 8:
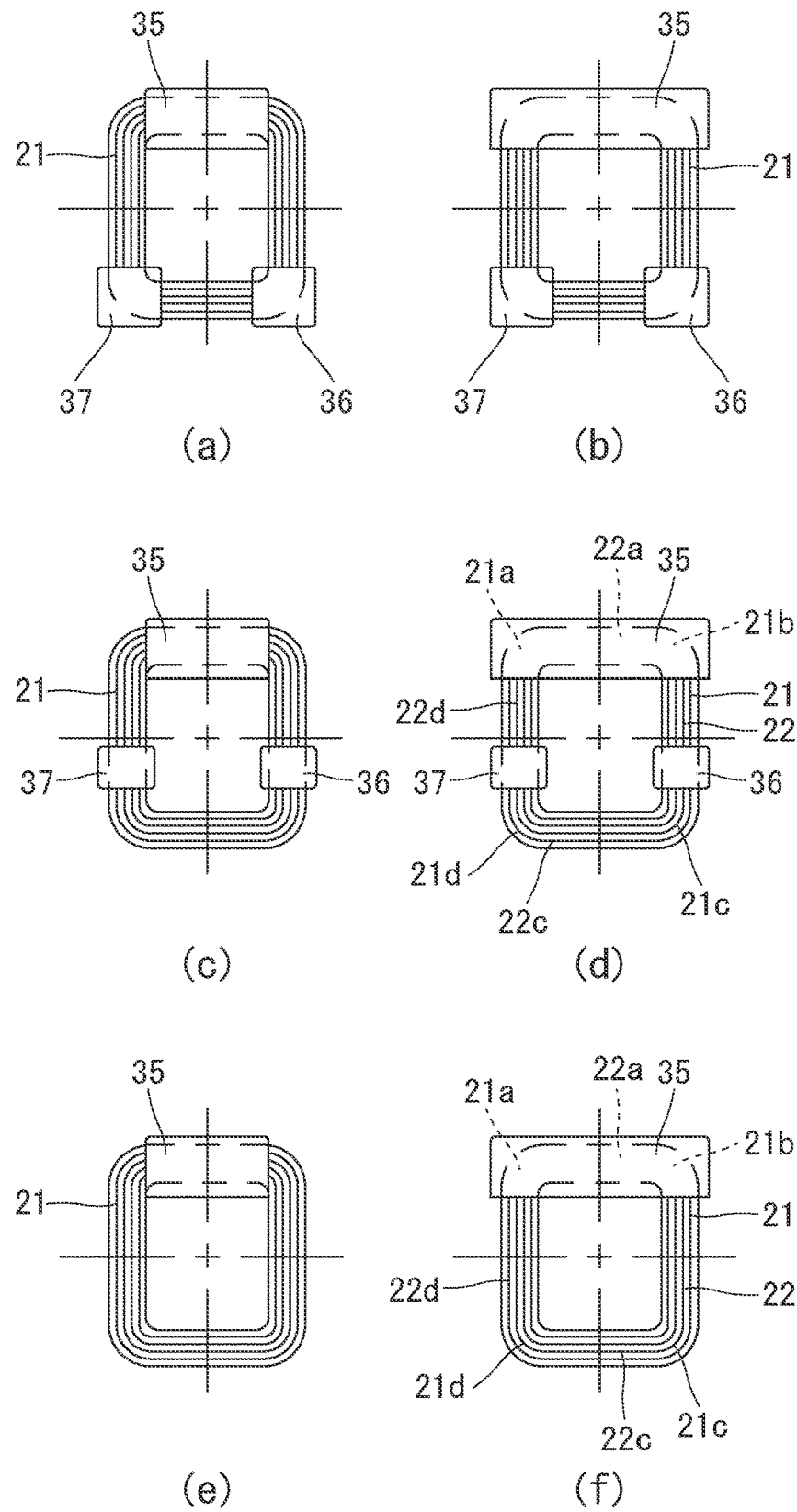
FIG. 8 is a diagram showing a plurality of arrangement forms of one or a plurality of mold resin portions with respect to a core member.
Figure 9:
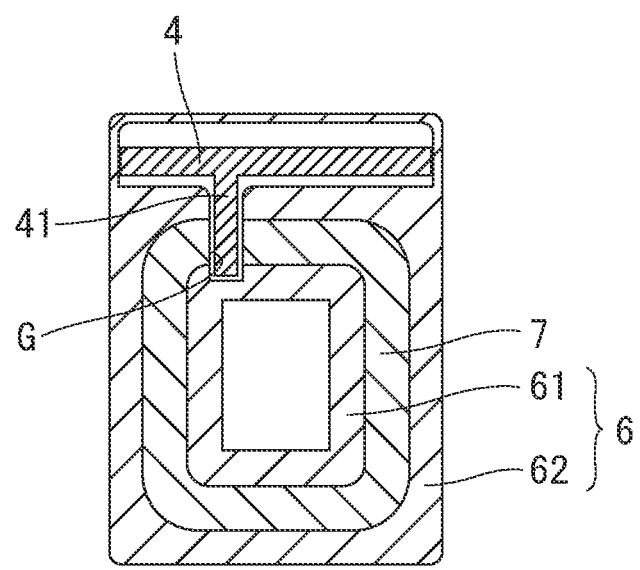
FIG. 9 is a cross-sectional view of a conventional electric current detector.

FIG. 8 shows a plurality of arrangement forms of one or a plurality of mold resin portions to be formed on the core member (21) before the magnetic gap is formed in the manufacturing process of the core component according to the present invention. In these forms, a mold resin portion (35) which has a long rectangular parallelepiped shape is cut for forming the gap.

In the form of FIG. 8(a), three mold resin portions (35), (36), (37) are formed on the core member (21), and the two mold resin portions (36), (37) on the lower side each cover the corners of the core member (21). In addition, in the form of FIG. 8(b), the three mold resin portions (35), (36), (37) are formed on the core member (21), and each of the mold resin portions (35), (36), (37) cover the corners of the core member (21).

In the form of FIG. 8(c), three mold resin portions (35), (36), (37) are formed on the core member (21), and any mold resin portions (35), (36), (37) do not cover the corners of the core member (21). In addition, in the form of FIG. 8(d), the three mold resin portions (35), (36), (37) are formed on the core member (21), and the mold resin portion (35) on the upper side covers two corners of the core member (21).

In the form of FIG. 8(e), one mold resin portion (35) is formed on the core member (21), and the mold resin portion (35) does not cover the corners of the core member (21). In addition, in the form of FIG. 8(f), one mold resin portion (35) is formed on the core member (21), and the mold resin portion (35) covers two corners of the core member (21).

Even when any of the forms is adopted, in the electric current detector according to the present invention, the surface of the mold resin portion (3) makes close contact with the inner surface of the outer case (1). Thereby, the core component (20) is precisely positioned into the outer case (1).

Table 1 below shows the results obtained by measuring the coercive forces (Hc) and the residual magnetic flux densities (Br) in the unmolded electric current detector in which after the core is accommodated in the previously manufactured outer case, the resin is filled into the outer case, the currently-used electric current detector in which the core is covered with the mold resin to form the outer case, and the partially-molded electric current detector according to the present invention.

TABLE 1

| | Coercive force (Hc) | | | Residual magnetic flux density (Br) | | |
|---|---|---|---|---|---|---|
| | Unmolded electric current detector | Currently-used electric current detector | Partially-molded electric current detector | Unmolded electric current detector | Currently-used electric current detector | Partially-molded electric current detector |
| | 237.1 | 310.1 | 224 | 41.8 | 62.2 | 42.0 |
| | 226.9 | 282.1 | 231 | 41.5 | 61.9 | 41.8 |
| | 246.3 | 311.3 | 237 | 43.0 | 60.9 | 44.9 |
| | 225.0 | 291.7 | 226 | 40.5 | 62.3 | 42.0 |
| | 225.8 | 277.4 | 225 | 40.3 | 58.2 | 41.8 |
| | 228.0 | 293.4 | 226 | 39.7 | 63.2 | 42.3 |
| | 227.6 | 304.8 | 238 | 40.8 | 59.8 | 43.6 |
| | 222.2 | 296.2 | 211 | 39.2 | 63.7 | 39.4 |
| (Average values) | 229.9 | 295.9 | 227.1 | 40.8 | 61.5 | 42.2 |
| (Comparison) | 100% | 128.7% | 98.8% | 100% | 150.6% | 103.4% |

As is apparent from Table 1, in the partially-molded electric current detector according to the present invention, the same magnetic characteristic as the conventional unmolded electric current detector is maintained, and hysteresis caused by the action of an external force at the time of resin molding is not increased.

On the contrary, the coercive force (Hc) and the residual magnetic flux density (Br) in the currently-used electric current detector are about 30% to 50% higher than those in the unmolded electric current detector, resulting in increasing hysteresis.

In this way, in the partially-molded electric current detector according to the present invention, part of the overall length along the magnetic path of the core (2) is only covered with the mold resin portion (3). Therefore, a force that the core (2) receives from the surroundings thereof at the time of molding the mold resin portion (3) is relatively smaller than that in the currently-used electric current detector, thereby preventing hysteresis from being increased.

In addition, in the electric current detector according to the present invention, the outer case (1) and the core component (20) can obtain a high accuracy in the outer shape dimensions thereof by the quality control in individual resin molding processes. Therefore, in the process for fixing the core component (20) into the outer case (1), the surface of the mold resin portion (3) is made in contact with the inner surface of the outer case (1), so that the core (2) can be precisely positioned into the outer case (1).

In addition, the outer case (1) is manufactured in the resin molding process different from that of the core component (20), so that any foreign particles such as dust can be prevented from entering into the resin which is the material of the outer case (1), thereby improving the manufacturing yield.

Further, in the manufacturing method of the core component according to the present invention, after the mold resin portion (32) is molded on the core member (21), the core member (21) and the mold resin portion (32) are cut to form the magnetic gap G. Therefore, when the core member (21) is a stacked type core member in which a plurality of electromagnetic steel plates are stacked, in the cutting process, the plurality of electromagnetic steel plates are constrained by the surroundings thereof by the mold resin portion (32), and are cut. This can avoid the separation of some electromagnetic steel plates and the entering of any magnetic particles, which are caused by the cutting, into the mold resin portion (32).

The configurations of the respective portions of the present invention are not limited to the above embodiment, and various modifications can be made within the technical range of the claims. For example, various configurations in which the core component (20) is fixed into the outer case (1), other than the configuration manufactured by adhesion with resin filling can be adopted without being limited to the engaging configuration of the slit (15) in the outer case (1) and the projection (31) on the core component (20).

DESCRIPTION OF REFERENCE CHARACTERS (1) Outer case
(16) Core accommodating chamber
(17) Board accommodating chamber
(20) Core component
(G) Magnetic gap
(2) Core
(3) Mold resin portion
(4) Printed circuit board
(41) Hall element

The invention claimed is:

1. A core component for an electric current detector, the core component comprising a polygonal-shaped core having a central opening, the core being in part covered with mold resin: wherein
said core comprises a plurality of corners and a plurality of linear portions extending between said corners to define said polygonal shaped core, wherein
one of the linear portions is a first linear portion having a magnetic gap,
said first linear portion being covered on an outer peripheral surface thereof with mold resin with the exception of the magnetic gap, which is not covered with mold resin, and
the corners not directly adjacent to said first linear portion are not covered with mold resin.

2. The core component according to claim 1, wherein at least one of said plurality of linear portions, except for said first linear portion, is in part covered on an outer peripheral surface thereof with mold resin.

* * * * *